United States Patent
Cosgrove

(10) Patent No.: US 10,302,686 B1
(45) Date of Patent: May 28, 2019

(54) SYSTEMS AND METHODS OF PROTECTING EQUIPMENT OPERATORS FROM ELECTROCUTION

(71) Applicant: Edwin Cosgrove, Modesto, CA (US)

(72) Inventor: Edwin Cosgrove, Modesto, CA (US)

(*) Notice: Subject to any disclaimer, the term of this patent is extended or adjusted under 35 U.S.C. 154(b) by 0 days.

(21) Appl. No.: 15/870,835

(22) Filed: Jan. 12, 2018

(51) Int. Cl.
| | |
|---|---|
| *G01R 29/08* | (2006.01) |
| *B66C 15/06* | (2006.01) |
| *G05B 9/02* | (2006.01) |
| *G01S 3/28* | (2006.01) |
| *G01S 3/04* | (2006.01) |

(52) U.S. Cl.
CPC .......... *G01R 29/085* (2013.01); *B66C 15/065* (2013.01); *G01S 3/046* (2013.01); *G01S 3/28* (2013.01); *G05B 9/02* (2013.01)

(58) Field of Classification Search
CPC .. G01R 29/085; B66C 15/065; A01M 7/0089; G05B 9/02
USPC ................................................... 340/539.23
See application file for complete search history.

(56) References Cited

U.S. PATENT DOCUMENTS

| | | | |
|---|---|---|---|
| 6,600,426 B1 | 7/2003 | Sacks | |
| 6,853,307 B2 * | 2/2005 | Nickerson | B66C 15/065 |
| | | | 340/551 |
| 8,477,027 B2 * | 7/2013 | Givens | B66C 13/44 |
| | | | 340/538 |
| 9,501,930 B2 | 11/2016 | Smith | |
| 2007/0018841 A1 * | 1/2007 | Nickerson | B66C 15/065 |
| | | | 340/685 |
| 2010/0214094 A1 | 8/2010 | Givens | |
| 2011/0153169 A1 * | 6/2011 | Peterson | A01M 7/0075 |
| | | | 701/50 |

OTHER PUBLICATIONS

Andres, David et al, Overhad Powerline Early Warning Devices for Cranes, Lifts and other Aerial Mobile Equipment, Berkeley Engineering and Research, Inc., May 15, 2014.

* cited by examiner

*Primary Examiner* — John A Tweel, Jr.
(74) *Attorney, Agent, or Firm* — Lynch LLP

(57) ABSTRACT

Systems of detecting high-voltage lines to guard against electrocution when using heavy machinery are disclosed. Systems of the inventive subject matter include an antenna to detect the high-voltage line, and upon detection, the system can cut power to a movement system of the heavy machinery. A manual override is provided so that a user can remove the heavy machinery from an area at risk of causing electrocution either by contact with the high-voltage line or by arcing from the high-voltage line.

17 Claims, 3 Drawing Sheets

SYSTEMS AND METHODS OF PROTECTING EQUIPMENT OPERATORS FROM ELECTROCUTION

FIELD OF THE INVENTION

The field of the invention is prevention of electrocution for equipment operators.

BACKGROUND

The background description includes information that may be useful in understanding the present invention. It is not an admission that any of the information provided in this application is prior art or relevant to the presently claimed invention, or that any publication specifically or implicitly referenced is prior art.

A serious danger facing equipment operators of all kinds (lifts, scissor lifts, fork lifts, backhoes, etc.) is the risk of electrocution by accidentally coming into contact with a high-voltage line. There has long been a need to address this issue with systems design to protect equipment operators, and efforts have been made to create such systems.

For example, U.S. Patent App. No. 2010/0214094A1, U.S. Pat. No. 9,501,930, and U.S. Pat. No. 6,600,426 all teach proximity sensing for high-voltage lines, where the proximity sensing is accomplished based on principles of induction. But all of these references fail to contemplate advancements and improvements to the state of the art that result in, for example, safety benefits to equipment operators.

For example, none of these references contemplate improvements that can allow an automatically shut down system to be manually overridden to bring an operator out of danger. Moreover, past efforts to solve this problem have introduced complicated microcontrollers and fail to appreciate that simpler, analog systems can be more reliable and easier and more cost effective to implement.

These and all other extrinsic materials discussed in this application are incorporated by reference in their entirety. Where a definition or use of a term in an incorporated reference is inconsistent or contrary to the definition of that term provided in this application, the definition of that term provided in this application applies and the definition of that term in the reference does not apply.

It has yet to be appreciated that improvements can be made to equipment safety systems to prevent electrocution of equipment operators. Thus, there is still a need in the art for improved safety systems to prevent electrocution when using equipment and machinery around high-voltage lines.

SUMMARY OF THE INVENTION

The present invention provides apparatus, systems, and methods in which high-voltage lines can be detected to avoid electrocution while operating equipment (e.g., heavy machinery).

In one aspect of the inventive subject matter, a safety system for a movement system capable of moving a person is contemplated. The safety system includes: an antenna for detecting a high-voltage line in proximity to the person; a switching component coupled with the antenna, where the switching component has a circuit configured to disable the movement system from moving the person when the antenna detects the high-voltage line; and a manual override switch to re-enable the movement system.

In some embodiments, the safety system also includes an alert-emitting component (e.g., a sound emitting component, a light emitting component, or both) coupled with the antenna, where the alert-emitting component is configured to emit sound when the antenna detects the high-voltage line.

It is contemplated that the manual override switch can be a momentary push button. In some embodiments, the antenna is configured to detect a high-voltage line when it comes within 10-15 feet of the high-voltage line. It is additionally contemplated that the circuit can be an analog circuit.

In another aspect of the inventive subject matter, a circuit to protect an operator from electrocution while using a piece of equipment is contemplated. The circuit includes: an antenna sub-circuit comprising an antenna and an amplifier; a switching sub-circuit coupled with the antenna sub-circuit, where the switching sub-circuit is configured to disable a movement subsystem of the piece of equipment when the antenna sub-circuit detects a high-voltage line; an alert indicator sub-circuit comprising an alert-emitting component; and an override sub-circuit comprising a mechanism to re-enable the movement subsystem of the piece of equipment.

In some embodiments, the alert-emitting component includes at least one of a sound-emitting component and a light-emitting component. It is contemplated that the mechanism to re-enable the movement subsystem can be a momentary push button. The antenna sub-circuit in some embodiments is configured to detect the high-voltage line when it comes within 10-15 feet of the high-voltage line. In some embodiments, every sub-circuit is an analog circuit.

In another aspect of the inventive subject matter, another safety system for a movement system capable of moving a person is contemplated. The safety system includes: an antenna for detecting a high-voltage line in proximity to the antenna; a switching component coupled with the antenna, where the switching component comprises a circuit configured to disable the movement system when the antenna detects the high-voltage line; and a manual override switch to re-enable the movement system.

One should appreciate that the disclosed subject matter provides many advantageous technical effects including automatic shutdown of some or all of a piece of equipment, with a manual override toggle to allow the equipment operator to take the equipment away from a dangerous area.

Various objects, features, aspects and advantages of the inventive subject matter will become more apparent from the following detailed description of preferred embodiments, along with the accompanying drawing figures in which like numerals represent like components.

DETAILED DESCRIPTION

Figure 1:
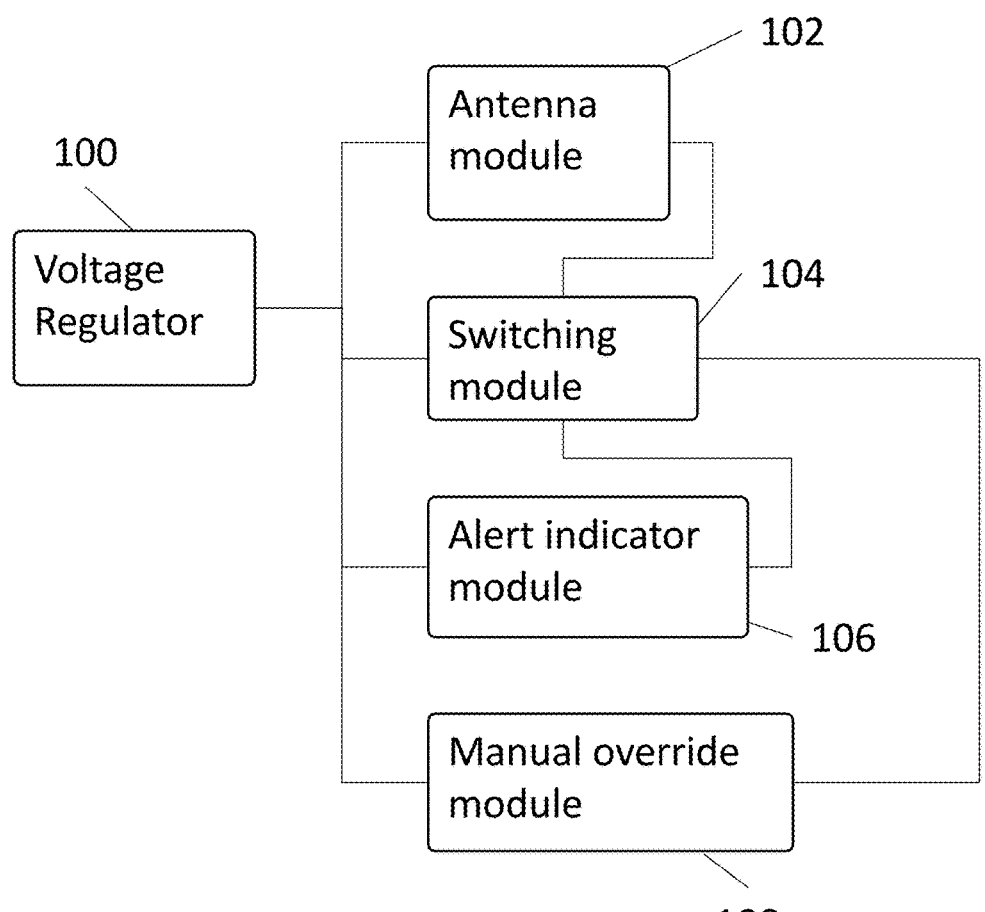
FIG. 1 is a schematic of an example circuit.

The following discussion provides example embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

As used in the description in this application and throughout the claims that follow, the meaning of "a," "an," and "the" includes plural reference unless the context clearly dictates otherwise. Also, as used in the description in this application, the meaning of "in" includes "in" and "on" unless the context clearly dictates otherwise.

Also, as used in this application, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

In some embodiments, the numbers expressing quantities are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements. Moreover, and unless the context dictates the contrary, all ranges set forth in this application should be interpreted as being inclusive of their endpoints and open-ended ranges should be interpreted to include only commercially practical values. Similarly, all lists of values should be considered as inclusive of intermediate values unless the context indicates the contrary.

Systems of the inventive subject matter are designed to prevent an equipment operator from being electrocuted by accidentally coming into contact with a high-voltage line. It is contemplated that a system of the inventive subject matter can be incorporated into equipment or other machinery such that, upon detection of a high-voltage line within close proximity of the system or the machinery or equipment, the system causes a shutdown within the equipment or machinery to prevent accidental contact with the high-voltage line. The terms "machinery," "equipment," and "heavy machinery" are used interchangeably in this application.

FIG. 1 shows a diagram of an embodiment of a safety system of the inventive subject matter. It is organized into different modules including a voltage regulator module 100, an antenna module 102, a switching module 104, an alert indicator module 106, and an override module 108. The voltage regulator module 100 provides regulated power to the other sub-circuits, and it is contemplated that any number of voltage regulators known in the art will suffice. In some embodiments, each of the modules includes analog circuit components, while in other embodiments, one or more of the modules are digitally controlled. Digital module control of any number of modules can be done by incorporating one or more microcontrollers into one or more of the modules.

Systems of the inventive subject matter detect the presence of a high-voltage line, and, upon detection, shut down power to all or a portion of another device or machine that the system is installed on. In some embodiments, an alert can be generated before the shutdown takes place. In other embodiments, the alert is generated at the same time that the shutdown takes place.

The antenna module 102 includes an antenna along with components necessary for the antenna to properly function. A variety of antennas are contemplated. An antenna of the inventive subject matter must be sufficiently sensitive to an electric field emitted by a high-voltage line such that it is capable of remotely detecting the presence of the line.

The switching module 104 includes a switching mechanism (e.g., a relay or another suitable switching component) that is can be turned from "on" to "off" when the antenna module detects the presence of a high-voltage line. It is contemplated that the switching module 104 is electronically coupled with a piece of machinery such that when it switches to the "off" position, all, or some portion, of the machinery loses power.

For example, in an embodiment of the safety system that is coupled with a lift having a bucket that an operator stands in, the switching module 104 can be coupled with the controls for the bucket such that, upon detecting a high-voltage line, the controls are disabled when the switching module 104 turns from "on" to "off." This prevents the person operating the machinery from bringing it into contact with the high-voltage line by arresting the machinery's movement. It is contemplated that the switching module 104 can be coupled with a specific subsystem (or subsystems) of the machinery (e.g., the movement controls, the movement system, or a combination of subsystems that affect or control movement of the machinery) to disable the subsystem upon detecting a high-voltage line.

The alert indicator module 106 is designed to give off an alert based on the signal from the antenna. If the antenna within the antenna module 102 indicates that a high-voltage line is within a threshold proximity, then the alert indicator module 106 can be activated. The alert indicator module 106 can have any combination of sound and light emitters.

Detection of a high-voltage line does not mean that the system's switching module 104 or the alert indicator module 106 must be activated. The antenna module 102 will detect the presence of a high-voltage line before either the system's switching module 104 or the alert indicator module 106 are activated. It is only when the system detects that the high-voltage line has come within a certain distance of the antenna module (e.g., near a person operating the machinery or near a portion of machinery that could cause electrocution if it comes into contact with a high-voltage line) that the system's switching module 104 or the alert indicator module 106 are activated.

It is contemplated that systems of the inventive subject matter can be configured to activate the system's switching module 104 or the alert indicator module 106 high-voltage lines at varying distances. The system can be created so that the switching module 104 is activated when a high-voltage line is detected to be at a distance of, for example, 5-10 feet, 10-15 feet, 15-30 feet, and 30-50 feet (preferably 10-15 feet). Being too close to high-voltage lines can result in a risk of arcing, depending on the voltage in the line, so the threshold for an alert and/or the switching module changing from "on" to "off" can be different in different embodiments. It is contemplated that the distance at which an alert is generated and the distance at which the switching module changes from "on" to "off" can be manually or automatically adjusted. In some embodiments, the alert indicator module 106 is configured to activate before the switching module 104 is actuated (e.g., the alert indicator module 106 is activated at a distance of 1-10 feet before the switching module 104 is activated). In some embodiments, the alert indicator module 106 is configured to activate simultaneously with the switching module 104.

The manual override module 108 is coupled with the switching module 104 so that when the switching module 104 changes from "on" to "off," the manual override module 108 can give a machinery operator the option to manually override the "off" condition. For example, if a machinery operator brings himself or his machinery too close to a high-voltage line, the machinery will stop moving when the switching module 104 changes from "on" to "off." The operator can then manually override the "off" condition to move the machinery away from the danger detected by the antenna module 102.

It is contemplated that the manual override module 108 can include a mechanism to override the "off" condition in the switching module 104. In embodiments where the manual override module is an analog circuit, the mechanism for manually overriding the "off" condition can be a "normally open" or "normally closed" button (depending on the configuration of the circuit), a switch, or any other type of button that can be depressed to override the "off" state of the switching module 104. It can be advantageous to have a "normally open" or "normally closed" button (again, depending on the configuration of the circuit) so that the button must be depressed (and held depressed) to regain normal functioning of the machinery.

It is contemplated that modules of the inventive subject matter can be configured to communicate wirelessly (e.g., via Bluetooth, WiFi, or any other wireless protocol).

Figure 2:
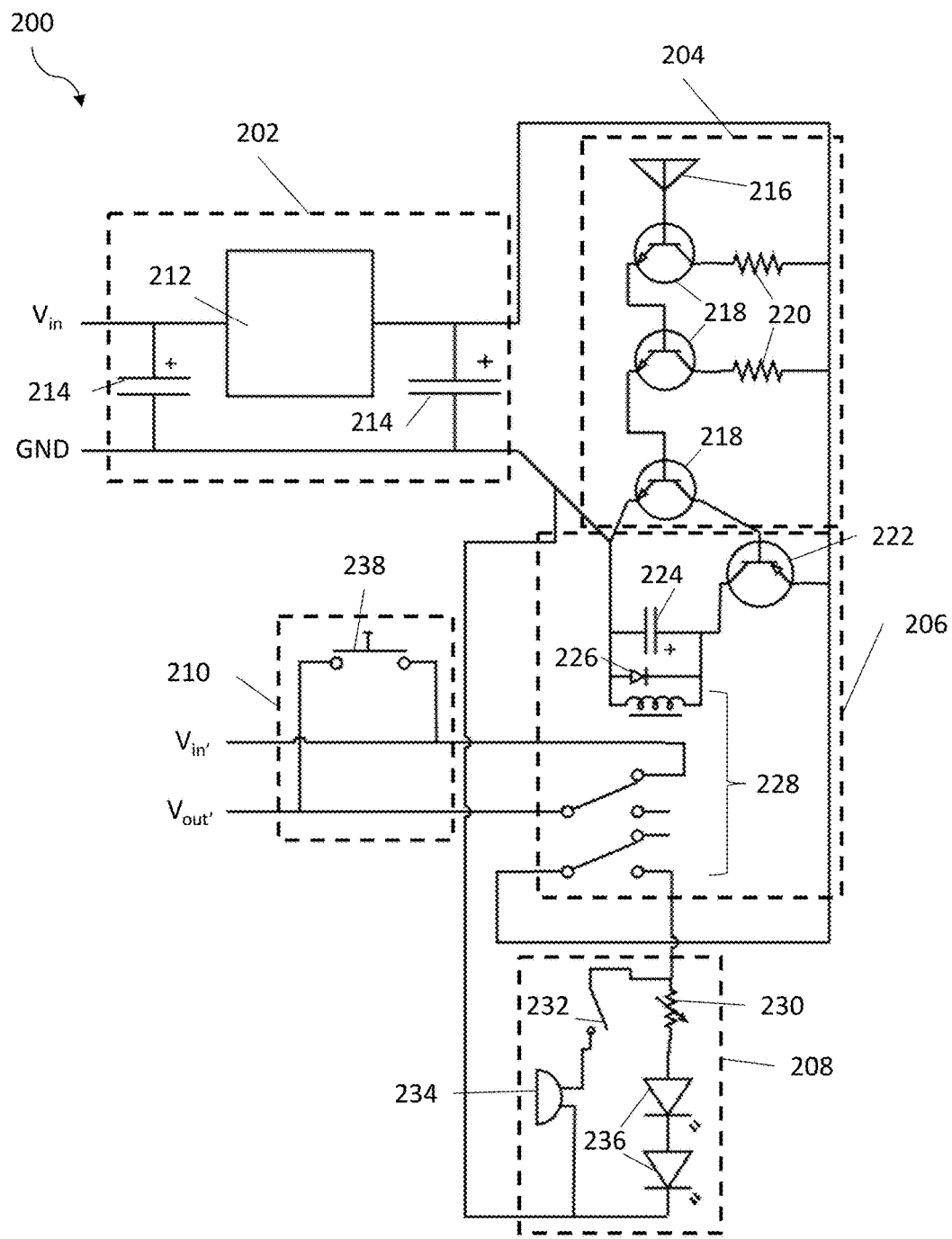
FIG. 2 is the schematic from FIG. 1 showing the different sub-circuits.

FIG. 2 shows a schematic of an analog circuit 200 of the inventive subject matter where portions of the circuit are identified as different sub-circuits. It is contemplated that the schematic shown in FIG. 2 can include fewer or additional circuit elements where necessary to adjust its function without departing from the inventive subject matter. It includes a voltage regulator sub-circuit 202, an antenna sub-circuit 204, a switching sub-circuit 206, an alert indicator sub-circuit 208, and an override sub-circuit 210.

The voltage regulator sub-circuit is shown to include a voltage regulator 212 and two capacitors 214. Inputs into the voltage regulator are $V_{in}$ (voltage in) and GND (ground), and the two capacitors 214 are located on either side of the voltage regulator 212 such that they couple $V_{in}$ to GND to help smooth the voltage supplied to the analog circuit 200. While a specific configuration is pictured in the schematic, it is contemplated that a wide variety of voltage regulator sub-circuits that all perform largely the same task of regulating voltage can be implemented.

The antenna sub-circuit 204 includes an antenna 216, three transistors 218, and two resistors 220. The transistors 218 and resistors 220 are implemented to amplify a signal received at the antenna 216. The two resistors 220 may be the same value or different values. In some embodiments, the components within the antenna sub-circuit can be selected to affect the sensitivity of the antenna in the antenna sub-circuit 204 to the presence of a high-voltage line. For example, in some embodiments, higher sensitivity is required (e.g., when the high voltage line carries 120V-220V). In other embodiments, the sensitivity can be turned down (e.g., when the high voltage line carries voltages on the order of 1+ kV).

Sensitivity of the antenna sub-circuit 204 can be tuned in association with adjustments to the switching sub-circuit 206 such that the switching sub-circuit 206 is not turned from "on" to "off" unless the antenna is brought within a threshold proximity of a high-voltage line, as described above. The switching sub-circuit 206 includes a transistor 222, a capacitor 224, a diode 226, and a DPDT relay 228. When a signal from the antenna sub-circuit 204 is received by the switching sub-circuit 206, the DPDT relay switches from an "on" position to an "off" position, depending on the intensity of the signal from the antenna sub-circuit 204. Intensity of a signal received by the switching sub-circuit from the antenna sub-circuit 204 depends on the configuration of the antenna sub-circuit, the antenna's proximity to a high-voltage line, and the amount of voltage carried by the high-voltage line.

The alert indicator sub-circuit 208 includes a variable resistor 230, an on/off switch 232, a buzzer 234 and two LEDs 236. The alert indicator sub-circuit 208 can be configured to generate an alert either when the switching sub-circuit 206 changes from "on" to "off" or it can be configured to generate an alert when a signal from the antenna sub-circuit indicates the antenna is within a threshold proximity, as discussed above (e.g., 1-10 ft distance from a distance where the switching sub-circuit would switch from "on" to "off").

The override sub-circuit 210 includes a momentary push button 238, and it is electronically coupled with a specific subsystem (or subsystems) of the machinery (e.g., the movement controls, the movement system, or a combination of subsystems that affect or control movement of the machinery) by its $V_{in}$, and $V_{out}$, leads. When a high-voltage line is sufficiently close to the antenna and the switching sub-circuit 206 changes from "on" to "off," the DPDT relay 228 changes states, causing a loss of power in the specific subsystem of the machinery that the override sub-circuit 210 is electronically coupled with. This change in state causes movement of the machinery to cease. Movement in the machinery can be manually restored by pressing the momentary push button 238, which allows a machinery operator to move the machinery away from a detected high-voltage line.

Figure 3:
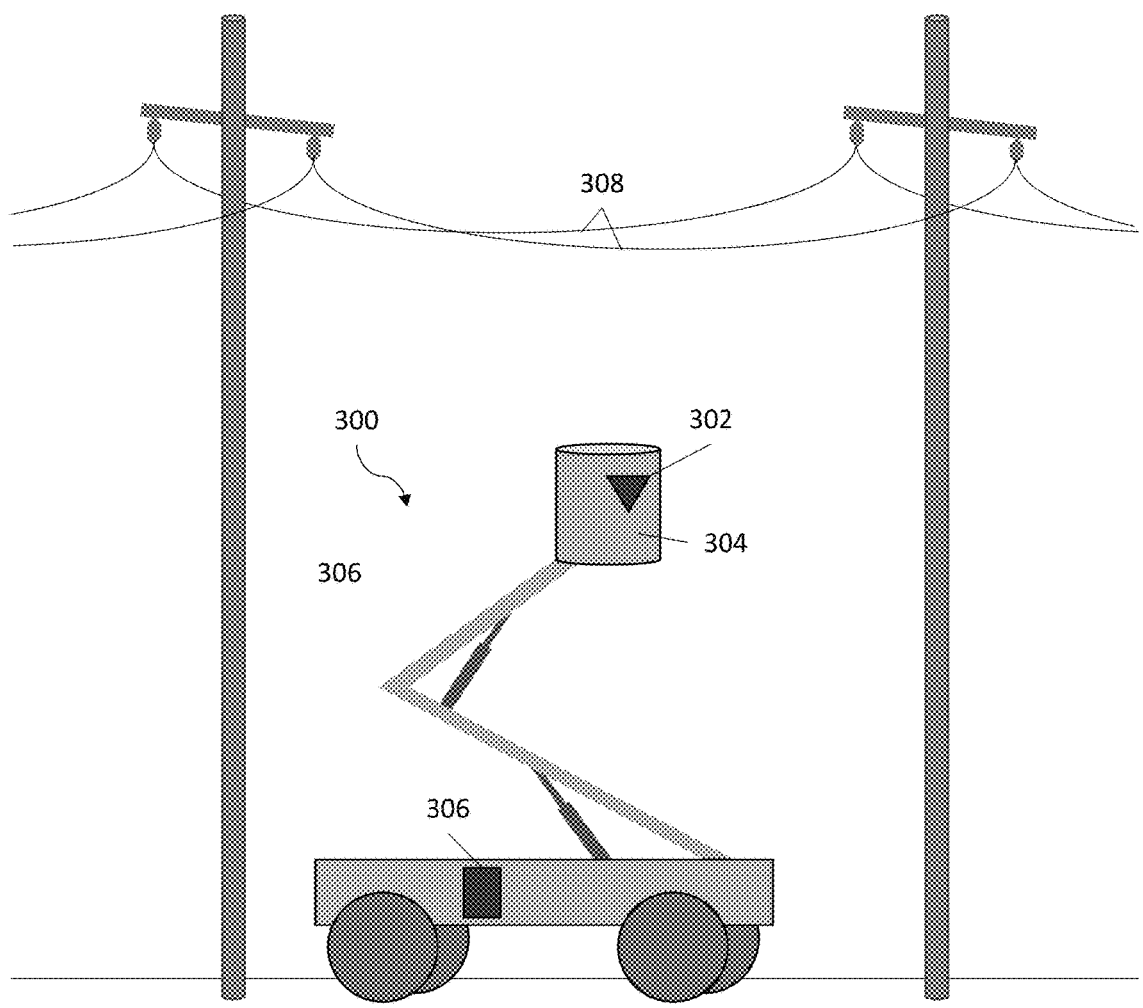
FIG. 3 is an illustration of a system of the inventive subject matter in operation.

FIG. 3 shows an example of an implementation of a system of the inventive subject matter. The system in FIG. 3 is used in association with a bucket lift 300. In this example, the antenna 302 is located on the bucket 304. It is not a requirement for the other components of the antenna module (or even other modules) to be located in close proximity to the antenna, though such configurations do not deviate from the inventive subject matter. In some embodiments, all modules of a system of the inventive subject matter are located on the bucket 304 at the location of the antenna 302, while in other embodiments, some modules can be located on the side of the bucket lift 300 at location 306. The location of the antenna 302 is important for determining proximity of high-voltage lines, so in all embodiments, the antenna 302 is attached at a location where detecting a high-voltage line 308 is important (e.g., at the same location as a person, or on a moving part that could come into contact with a high-voltage line, such as a bucket on a bucket lift).

For embodiments such as the one shown in FIG. 3, the manual override button should be located in a place where an operator can use it. For example, if a person is operating the bucket lift 300 from inside the bucket 304, then the manual override button should be located such that the person inside the bucket 304 can access it. This gives that person the ability to re-enable movement of the bucket 304 so they can remove themselves from danger when a high-voltage line is detected within a threshold proximity.

In some embodiments, the manual override button can be in a location that is accessible from the ground, such as location 306. It is often the case that bucket lifts have both ground controls and bucket controls to control movement, and if an operator is using the ground controls to move the bucket around, that operator will need access to the manual override button if switching module changes from "on" to "off."

Thus, specific systems and circuits designed to guard users of machinery from electrocution by accidental contact with high-voltage lines have been disclosed. It should be apparent, however, to those skilled in the art that many more modifications besides those already described are possible without departing from the inventive concepts in this application. The inventive subject matter, therefore, is not to be restricted except in the spirit of the disclosure. Moreover, in interpreting the disclosure all terms should be interpreted in the broadest possible manner consistent with the context. In particular the terms "comprises" and "comprising" should be interpreted as referring to the elements, components, or steps in a non-exclusive manner, indicating that the referenced elements, components, or steps can be present, or utilized, or combined with other elements, components, or steps that are not expressly referenced.

What is claimed is:

1. A safety system comprising:
    an antenna sub-circuit for detecting a high-voltage line in proximity to a person, the antenna sub-circuit comprising at least three transistors and two resistors and configured to generate a signal when the antenna detects the high-voltage line at a first proximity;
    an alert indicator sub-circuit configured to produce an alert when the antenna detects a high-voltage line at a second proximity, wherein the second proximity is greater than the first proximity;
    a switching sub-circuit configured to receive the signal from the antenna sub-circuit, wherein the switching sub-circuit is configured to, upon receiving the signal, disable a movement system from moving the person;
    wherein the switching sub-circuit comprises a transistor, a capacitor, a diode, and a relay that are configured to cause the relay to switch upon receiving the signal;
    a proximity adjusting sub-system configured to adjust both the first proximity and the second proximity;
    a manual override switch to re-enable the movement system, the manual override switch being positioned in proximity to movement controls that are coupled with the movement system to facilitate activating the manual override switch while also providing input to the movement controls; and
    wherein the manual override switch comprises a momentary push button configured to, upon activation, bypass the relay to re-enable the movement system.

2. The safety system of claim 1, further comprising an alert-emitting component coupled with the antenna, wherein the alert-emitting component is configured to emit sound when the antenna detects the high-voltage line.

3. The safety system of claim 2, wherein the alert-emitting component comprises at least one of a sound-emitting component and a light-emitting component.

4. The safety system of claim 1, wherein the relay comprises a DPDT relay.

5. The safety system of claim 1, wherein the antenna is configured to detect the high-voltage line when it comes within 10-15 feet of the high-voltage line.

6. The safety system of claim 1, wherein every sub-circuit is an analog circuit.

7. A circuit to protect an operator from electrocution while using a piece of equipment, the circuit comprising:
    an antenna sub-circuit comprising an antenna and an amplifier and configured to generate a signal when the antenna detects the high-voltage line;
    a switching sub-circuit coupled with the antenna sub-circuit and configured to receive the signal from the antenna sub-circuit, the switching sub-circuit further configured to, upon receiving the signal, disable a movement system of the piece of equipment;
    an alert indicator sub-circuit comprising an alert-emitting component and configured to produce an alert upon receiving the signal from the antenna sub-circuit;
    an override sub-circuit comprising a mechanism to re-enable the movement system of the piece of equipment, the mechanism being positioned in proximity to movement controls that are coupled with the movement system to facilitate activating the mechanism while also providing input to the movement controls; and
    wherein the mechanism comprises a momentary push button configured to, upon activation, bypass the relay to re-enable the movement system.

8. The circuit of claim 7, wherein the alert-emitting component comprises at least one of a sound-emitting component and a light-emitting component.

9. The circuit of claim 7, wherein the relay comprises a DPDT relay movement system.

10. The circuit of claim 7, wherein the antenna sub-circuit is configured to detect the high-voltage line when it comes within 10-15 feet of the high-voltage line.

11. The circuit of claim 7, wherein every sub-circuit is an analog circuit.

12. A safety system for a movement system capable of moving a person, comprising:
    an antenna for detecting a high-voltage line in proximity to the antenna, the antenna sub-circuit comprising at least three transistors and two resistors and configured to generate a signal when the antenna detects the high-voltage line;
    a switching sub-circuit configured to receive the signal from the antenna sub-circuit, wherein the switching sub-circuit is configured to, upon receiving the signal, disable a movement system;
    wherein the switching sub-circuit comprises a relay that is configured to switch upon receiving the signal to disable the movement system;
    a manual override switch to re-enable the movement system, the manual override switch being positioned in proximity to movement controls that are coupled with the movement system to facilitate activating the manual override switch while also providing input to the movement controls; and
    wherein the manual override switch comprises a momentary push button configured to, upon activation, bypass the relay to re-enable the movement system.

13. The safety system of claim 12, further comprising an alert-emitting component coupled with the antenna, wherein the alert-emitting component is configured to emit sound when the antenna detects the high-voltage line.

14. The safety system of claim 13, wherein the alert-emitting component comprises at least one of a sound-emitting component and a light-emitting component.

15. The safety system of claim 12, wherein the relay comprises a DPDT relay.

16. The safety system of claim 12, wherein the antenna is configured to detect the high-voltage line when it comes within 10-15 feet of the high-voltage line.

17. The safety system of claim 12, wherein the switching sub-circuit and the manual override circuit are analog circuits.

* * * * *